(12) United States Patent
Hardin

(10) Patent No.: US 6,556,437 B1
(45) Date of Patent: Apr. 29, 2003

(54) ERGONOMIC CARRIER FOR HOT-SWAP COMPUTER COMPONENTS

(75) Inventor: George T. Hardin, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 141 days.

(21) Appl. No.: 09/636,113

(22) Filed: Aug. 10, 2000

(51) Int. Cl.⁷ .................................................. G06F 1/16
(52) U.S. Cl. ..................... 361/687; 361/694; 415/213.1; 416/178; 454/184
(58) Field of Search .................. 361/687, 694, 361/695; 415/213.1, 214.1, 215.1; 454/184; 416/178

(56) References Cited

U.S. PATENT DOCUMENTS

| | | | | |
|---|---|---|---|---|
| 4,982,303 A | | 1/1991 | Krenz | 360/137 |
| 5,011,198 A | | 4/1991 | Gruenberg et al. | 292/41 |
| 5,020,151 A | | 5/1991 | Sampei et al. | 455/345 |
| 5,208,730 A | * | 5/1993 | Tracey | 361/695 |
| 5,321,962 A | | 6/1994 | Ferchau et al. | 70/208 |
| 5,359,492 A | | 10/1994 | Porter | 361/683 |
| 5,514,036 A | * | 5/1996 | Lin | 454/184 |
| 5,713,790 A | * | 2/1998 | Lin | 454/184 |
| 5,761,045 A | | 6/1998 | Olson et al. | 361/726 |
| 5,788,566 A | | 8/1998 | McAnally et al. | 454/184 |
| 5,928,016 A | | 7/1999 | Anderson et al. | 439/159 |
| 5,978,212 A | * | 11/1999 | Boulay et al. | 361/685 |
| 6,031,719 A | | 2/2000 | Schmitt et al. | 361/695 |
| 6,222,736 B1 | | 4/2001 | Sim et al. | 361/727 |
| 6,236,564 B1 | * | 5/2001 | Fan | 361/695 |
| 6,269,001 B1 | * | 7/2001 | Matteson et al. | 361/695 |
| 6,343,011 B1 | * | 1/2002 | Yu | 361/695 |
| 6,351,380 B1 | | 2/2002 | Curlee et al. | 361/695 |

OTHER PUBLICATIONS

U.S. Pending patent application Ser. No. 09/360,467 entitled "Fanless Power Supply" by Robert Bassman, et al.; Dell USA, L.P. (DC–01927), filed Jul. 23, 1999.

* cited by examiner

*Primary Examiner*—Darren Schuberg
*Assistant Examiner*—Yean Hsi Chang
(74) *Attorney, Agent, or Firm*—Baker Botts L.L.P.

(57) ABSTRACT

A fan carrier assembly for hot swap computer components such as computer fans is provided. The fan carrier assembly preferably includes a handle operable to engage a pair of latches such that when the handle is employed to remove the carrier and component from the computer system, a single motion both releases the latches from engagement as well as displaces the component from its engaged position.

20 Claims, 5 Drawing Sheets

ERGONOMIC CARRIER FOR HOT-SWAP COMPUTER COMPONENTS

TECHNICAL FIELD

The present invention relates generally to hot-swap computer components and, more particularly, to an ergonomic carrier for a hot-swap computer system cooling fan.

BACKGROUND

Computers and many other types of electronic equipment generally include fans for cooling the equipment itself or for cooling specific components of the equipment. For example, one or more computer system cooling fans may be mounted within the chassis of a computer to cool the computer system itself, power supply, microprocessors, hard drives as well as other components that generate heat during operation.

In most modern day computer systems, particularly server systems, a plurality of computer system cooling fans may be employed to keep the components contained therein cool. Generally, the computer system cooling fans employed in such computer systems are typically of the hot-swap design, allowing them to be removed and replaced while the computer system is operating. However, current designs of hot-swap computer system cooling fans have generally not made their removal as ergonomic as may be possible.

For example, many hot-swap computer system cooling fans may be removed from a fan bay by squeezing together a pair of spaced apart latches using the index finger and thumb of one hand such that the computer system cooling fan may be disengaged from the fan bay and subsequently lifting the computer system cooling fan until it clears the fan bay. Such hot-swap fan designs generally require at least two motions to effect their removal.

As computer components continue to decrease in size, more components are generally being incorporated into computer systems. In addition to the increase in component populations, advances in abilities such as processor speed have caused the heat emission levels of some computer systems to increase as well, placing additional significance on the efficiency with which computer system cooling fans may be replaced.

Due in part to the increased heat, computer system cooling fans have increased in size. Such an increase in size is generally to create more airflow and to generate greater cooling capacity. With this increase in size of computer system cooling fans, has come an increase in the distance between the latches used to engage a computer system cooling fan with a fan bay. This increase in distance between latches has generally made the removal of computer system cooling fans from the fan bay much more difficult for all but those with exceptionally large hands or the coordination to use both hands to squeeze such a distanced pairing of latches.

SUMMARY

In accordance with teachings of the present disclosure, an ergonomic carrier for hot-swap computer components is provided. In one aspect, a fan carrier for a hot-swap computer fan is provided. The fan carrier preferably includes respective first and second sides, respective first and second ends as well as a bottom plate. The bottom plate, respective first and second sides and respective first and second ends preferably cooperate with each other to form a box having an opening. The first and second sides preferably include respective first and second faces, first and second edges as well as a top and bottom edge. In addition, the respective sides preferably further include at least one aperture disposed on the respective first and second sides, the aperture preferably penetrating the first and second faces thereon. The respective first and second ends preferably include first and second faces, first and second edges and a top and bottom edge. A respective cantilever latch is also preferably included proximate the top edge of the first and second ends. The cantilever latches preferably includes a tab disposed thereon. A handle preferably disposed proximate the opening of the box and operably coupled to each tab, is also preferably included in the fan carrier. The handle is preferably operable to cause the cantilever latches to be drawn towards one another upon displacement of the handle with respect to the bottom plate.

In another aspect, a computer system having a chassis, a motherboard disposed within the chassis, at least one processor and memory operably coupled one another and to the motherboard, as well as a fan bay disposed within the chassis and operably associated with the motherboard is provided. A fan carrier, with a fan disposed therein operable to engage the fan bay is also preferably included in the computer system. The fan carrier preferably includes first and second latches operable to engage first and second slots of the fan bay. A handle is preferably included operably coupled to the first and second latches and is preferably operable to draw the first and second latches towards one another such that the first and second latches disengage the first and second slots of the fan bay.

In yet another aspect, a fan carrier is provided having respective first and second sides and respective first and second ends. The sides and ends of the fan carrier preferably cooperate to form a box. The respective first and second ends preferably include respective latches disposed proximate a top edge thereof. The latches are preferably operable to engage respective fan bay notches such that the fan carrier may be removably maintained within the fan bay. The first and second ends preferably further include respective guide rails operable to engage respective guide slots of the fan bay. A handle operably coupled to the latches is also preferably included. The handle is preferably operable to disengage the latches from the fan bay notches such that the fan carrier may be removed from therein.

One technical advantage provided by the carrier of the present disclosure is the ability to effect removal of a hot-swap computer component with a single motion.

Additional technical advantages provided by the teachings of the present disclosure are the manufacturing economies that may result from the manufacturing of the carrier of the present disclosure from two generally symmetric halves.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 8, wherein like numbers are used to indicate like and corresponding parts. Referring first to FIG. 1A, one side of a fan carrier incorporating teachings of the present disclosure is shown. One of many manufacturing techniques, such as sheet metal stamping or plastic injection molding, may be employed in the manufacture of a fan carrier as described in the present disclosure.

Figure 1A:
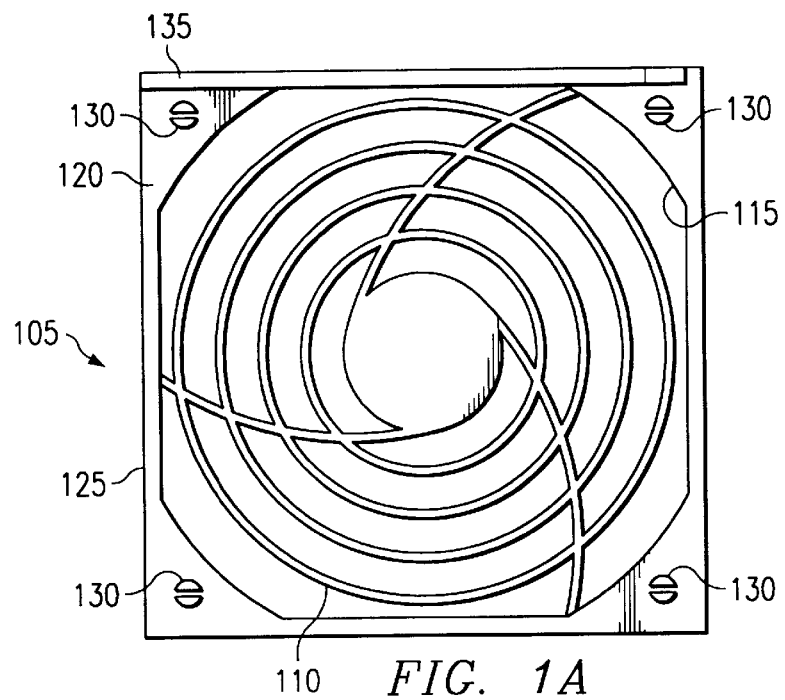
FIG. 1A is a schematic drawing in elevation with portions broken away illustrating one side of a fan carrier incorporating teachings of the present disclosure.

Carrier side 105 is preferably generally square and generally compatible in size with the dimensions of a computer fan housing (see FIG. 4) with which it is to be employed. As illustrated in FIG. 1A, carrier side 105 preferably includes first face or surface 120 and second face or surface 125 with aperture 115 extending therethrough. Fan grating 110 may be disposed within aperture 115.

Also illustrated in FIG. 1A are mechanical fasteners 130. Mechanical fasteners 130 are preferably operable to engage similarly positioned apertures on a computer fan housing (see FIG. 4). Mechanical fasteners 130 may include, but are not limited to, snaps, rivets, screws, and locking tabs. Alternatively, apertures may be placed in the general location of mechanical fasteners 130 on carrier side 105 such that non-integrated screws, rivets, etc., may be employed to hold a fan and fan carrier assembly together.

LED (light emitting diode) holder 135 may be seen disposed along one edge of carrier side 105. In one embodiment, a pair of carrier sides 105 may be positioned on opposite sides of a computer fan housing with which a fan carrier of the present disclosure is preferably employed (see FIG. 4).

Figure 1B:
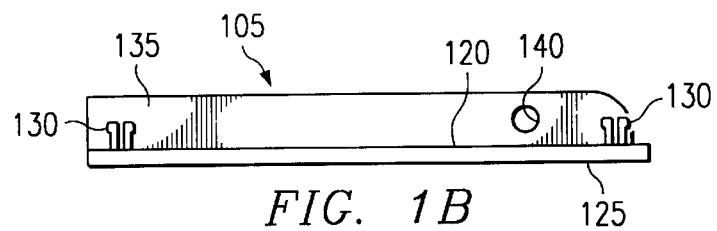
FIG. 1B is a schematic drawing in elevation with portions broken away taken along lines 1B—1B of FIG. 1A.

Referring now to FIG. 1B, an alternate view of carrier side 105 is shown. As illustrated in FIG. 1B, LED holder 135 may be positioned generally normal to first face 120 of carrier side 105. Also included on LED holder 135 is LED aperture 140. LED aperture 140 is preferably operable to maintain an LED therein. An LED maintained by LED holder 135 may be used to indicate status of electrical connections, operating integrity and other characteristics associated with a computer fan or computer system.

Figures 2A, 2B, 3:
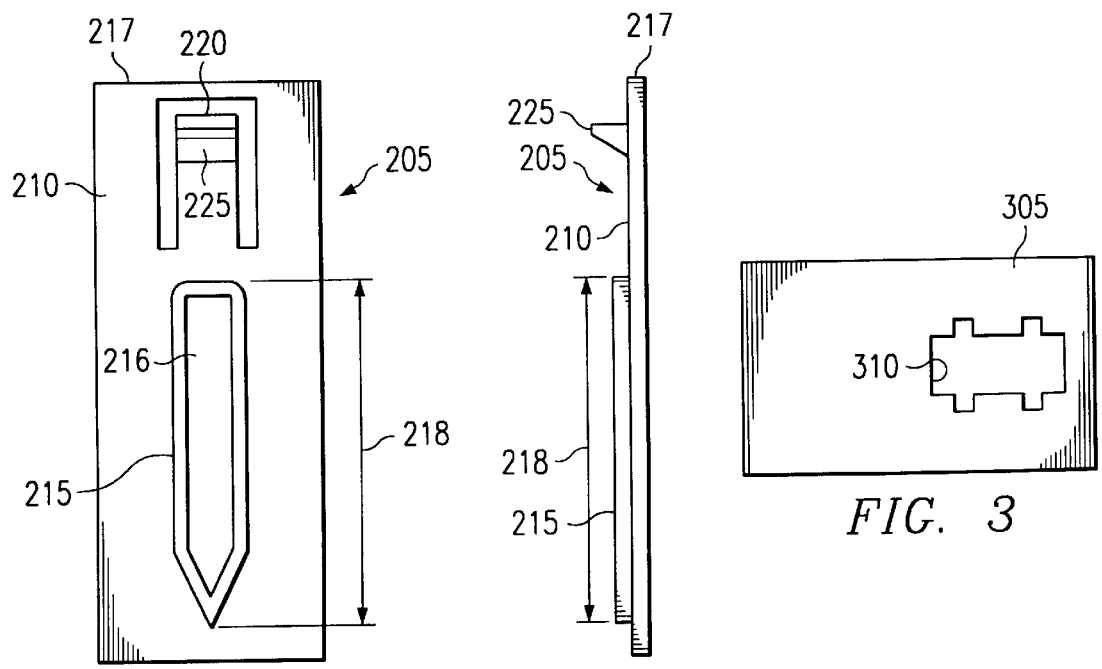
FIG. 2A is a schematic drawing in elevation illustrating one end of a fan carrier incorporating teachings of the present disclosure.
FIG. 2B is a schematic drawing in elevation with portions broken away taken along lines 2B—2B of FIG. 2A.
FIG. 3 is a plan view illustrating a bottom plate of a fan carrier incorporating teachings of the present disclosure.

In FIG. 2A, a plan view illustrating one end of a fan carrier incorporating teachings of the present disclosure is shown. Carrier end 205 is generally rectangular and preferably includes dimensions proximate that of the thickness of an associated computer fan housing.

Preferably coupled to first face or surface 210 of carrier end 205 is carrier guide rail 215. Carrier guide 215 is preferably operable to guide the fan carrier of the present disclosure into and out of a fan bay (illustrated in FIG. 6) included in a computer system such that the carrier and fan assembly as well as any electrical connections may be properly seated. Further, carrier guide 215, as illustrated in FIG. 2B, is raised from first face 210 and preferably includes aperture 216 formed therein. Length 218 of carrier guide 215 may be designed such that travel of the fan carrier within a fan bay is limited. One result of limiting the travel of a fan carrier within a fan bay is that system and/or motherboard damage may be prevented.

Preferably disposed on carrier end 205 is cantilever latch 220. As illustrated in FIG. 2A, cantilever latch 220 may be formed as an integral component of carrier end 205. However, other methods of attaching a latch, whether cantilever or any other form, on carrier end 205 are considered within the scope of the present disclosure. Preferably coupled to cantilever latch 220 is tab 225. Tab 225 is preferably operable to engage a fan bay notch preferably included in a fan bay guide slot such that the carrier of the present disclosure may be removably or releasably fixed within a fan bay.

FIG. 2B illustrates an elevation view of carrier end 205 illustrated in FIG. 2A according to teachings of the present disclosure. As illustrated in FIG. 2B, tab 225 is preferably ramped or sloped. Forming tab 225 with a sloped surface preferably enables a fan carrier of the present disclosure to easily slide into a fan bay and engage a fan bay notch or recess located therein. Other benefits that may result from the sloping of tab 225 will be discussed in greater detail below.

Also illustrated in FIG. 2B is the raised nature of carrier guide 215. Carrier guide 215 is preferably raised to a height which allows carrier guide 215 to engage a fan bay guide slot such that fan carrier travel within a corresponding fan bay is guided but not impeded. In addition, length 218 of carrier guide 215 is further illustrated in FIG. 2B.

Referring now to FIG. 3, a plan view illustrating one embodiment of a bottom plate preferably included in a fan carrier incorporating teachings of the present disclosure is shown. Bottom plate 305 is generally rectangular and preferably has a width proximate that of a computer fan housing. The length of bottom plate 305 may vary depending on the method of manufacture employed. Greater detail regarding the possible lengths of bottom plate 305 will be discussed below.

Bottom plate 305 may serve a variety of purposes in the fan carrier of the present disclosure. One such purpose of bottom plate 305 is to provide support to or to act as a base for a fan placed in the fan carrier.

Aperture 310 may also be included in bottom plate 305 and is preferably operable to maintain a plug, such as an electrical plug, therein. In one such embodiment, a blind mate plug may be positioned in aperture 310 to further simplify use of the fan carrier of the present disclosure. One such blind mate plug that may be used, but is not limited to, is a Molex plug.

Figure 4:
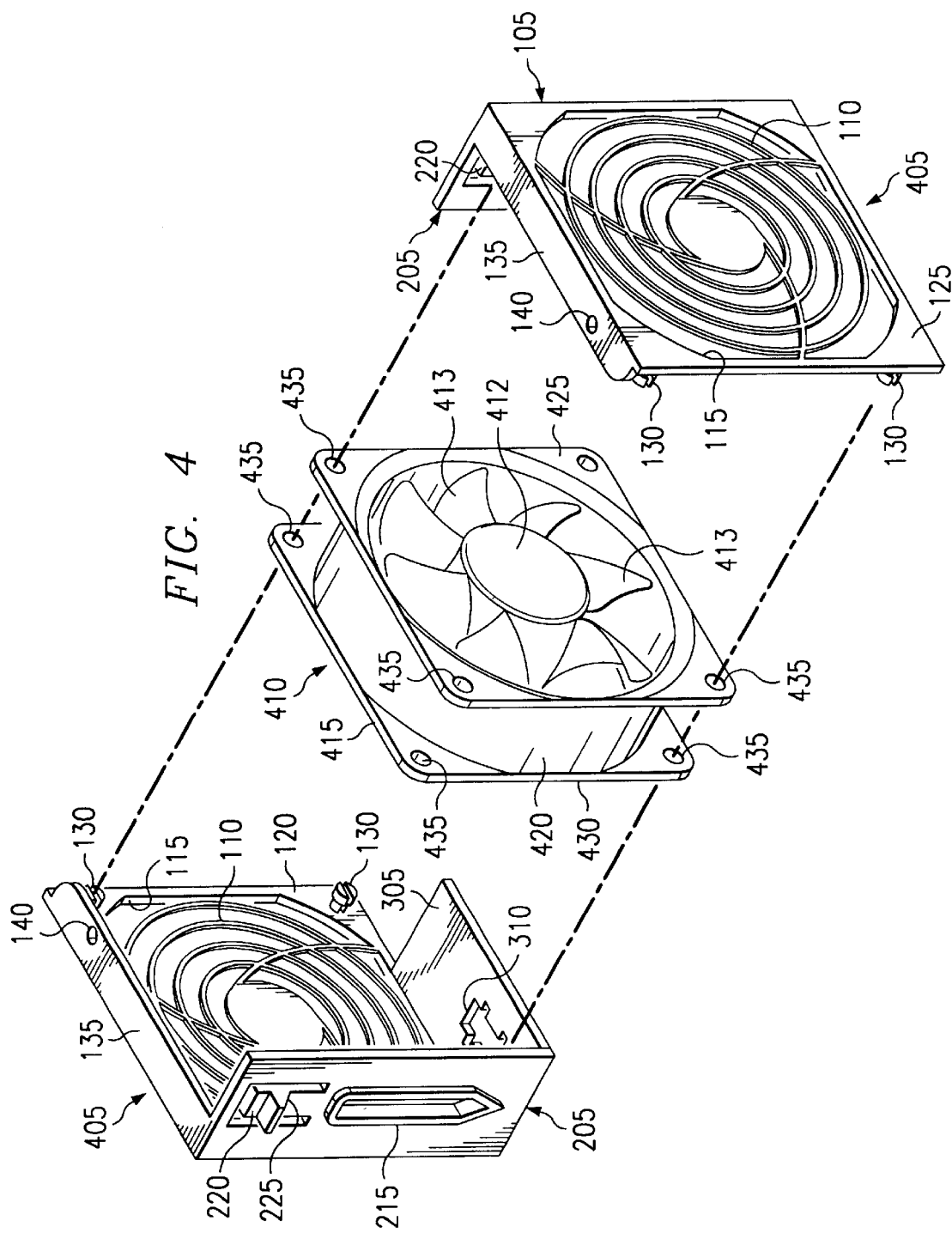
FIG. 4 is a schematic drawing showing an exploded view with portions broken away of a fan and fan carrier assembly incorporating teachings of the present disclosure.

FIG. 4 is an exploded drawing of a fan, fan housing and fan carrier assembly incorporating teachings of the present disclosure. In part to effect economies of manufacturing, a fan carrier of the present disclosure may be manufactured from two generally symmetric sections or halves. As such, carrier sections 405 as shown in FIG. 4 each includes a respective carrier end 205, carrier side 105 and bottom plate 305 formed as integral components. By forming carrier halves or sections 405 as illustrated in FIG. 4, only one carrier mold may be required to manufacture a fan carrier assembly. The need to create only a single mold may result in reduced manufacturing costs.

In a preferred operating mode, a fan carrier of the present disclosure is preferably engaged with a computer system fan such as fan 410. Fan 410 preferably includes motor 412, blades 413 and housing 415. Housing 415 of fan 410 preferably includes a generally circular center region 420 as well as sides 425 and 430. A plurality of apertures 435 are preferably included on fan 410 and are generally positioned proximate the respective corners of sides 425 and 430.

As illustrated in FIG. 4, a respective carrier section or half 405 is preferably disposed on both side 425 and side 430 of fan 410. Positioning carrier halves 405 as illustrated in FIG. 4 forms an open top box that is preferably operable to receive a fan, such as fan 410, therein. Accordingly, the dimensions with which carrier halves 405 are preferably manufactured generally correspond with the dimensions of housing 415 of fan 410 and preferably allow fan 410 to be securely disposed between two carrier halves 405. Therefore, sides 425 and 430 of fan 410 are similar in size to carrier sides 105 and vice versa.

Mechanical fasteners 130 on carrier sides 105 of carrier halves 405 are positioned such that they may align with and engage apertures 435 on sides 425 and 430 of fan housing 415. For one embodiment, carrier half 405 preferably uses snaps as mechanical fasteners 130, to releasably engage apertures 435.

Figure 5:
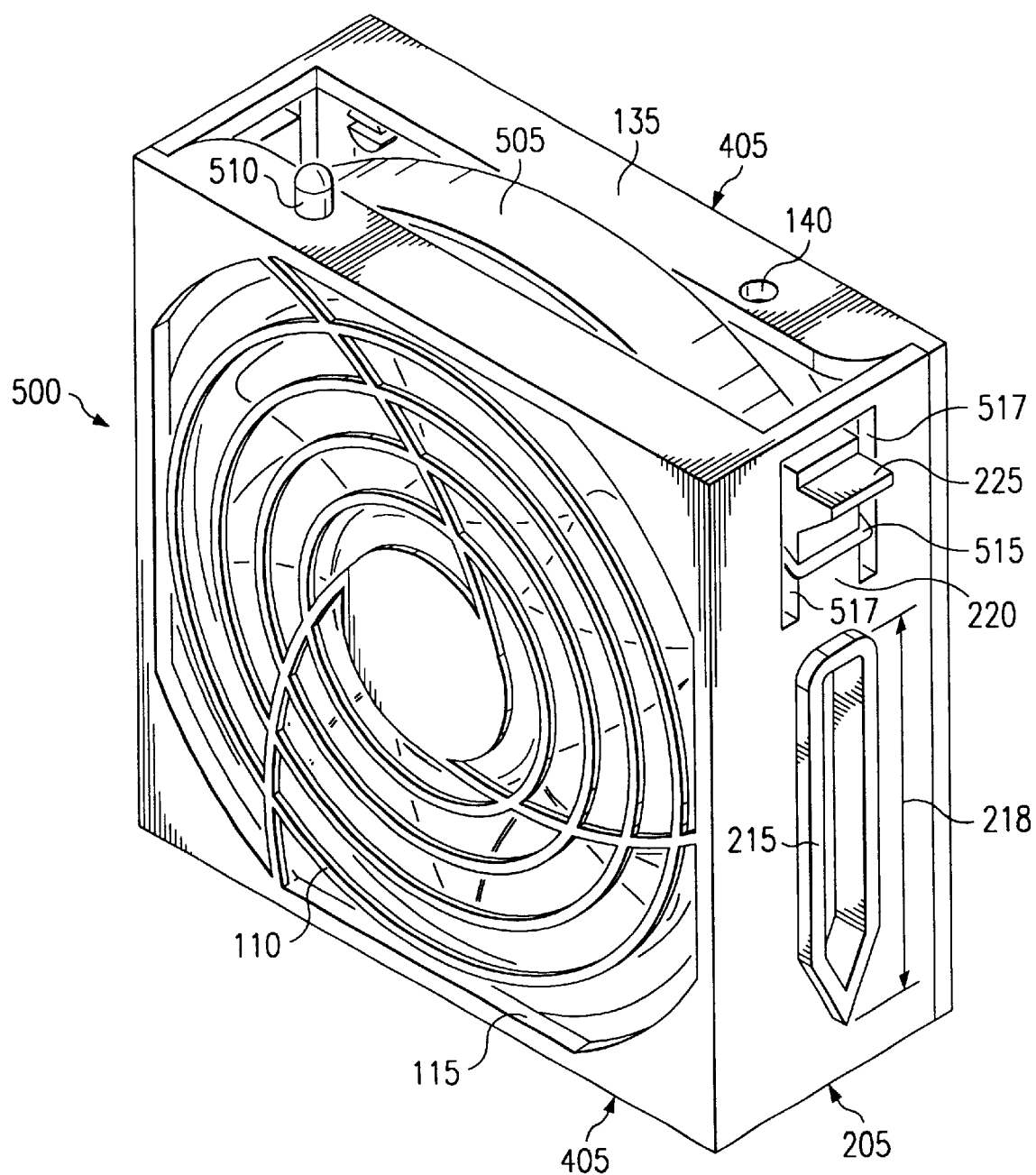
FIG. 5 is a schematic drawing showing an isometric view of a further embodiment of a fan and fan carrier assembly incorporating teachings of the present disclosure.

Referring now to FIG. 5, an isometric view of one embodiment of a fan and fan carrier assembly incorporating teachings of the present disclosure is shown. Upon engaging carrier halves 405 with fan 410, preferably coupling handle 505 to latches 220, as well as adding LED 510 to LED holder 135, fan carrier assembly 500, generally as depicted in FIG. 5, results.

Handle 505 is preferably made from a resilient, flexible material such as rubber, Sterilite o r a similar material. Respective loops 515 are preferably attached to opposite ends of handle 505. As mentioned above, tab 225 of cantilever latch 220 is preferably ramped or sloped. An additional benefit of sloping tab 225 is that when using handle 505 to remove fan carrier assembly 500 from a fan bay, the pulling force exerted by loop 515 is generally normal to the sloped surface of tab 225. As such, tab 225 may have, approximately, a thirty degree slope on one side.

The configuration and dimensions of loops 515 are preferably selected to engage cantilever latches 220 and tabs 225. In addition, loops 515 permit handle 505 to be repositioned with respect to the open top of fan carrier assembly 500 by traveling along the length of slots 517 associated with cantilever latches 220.

Figure 6:
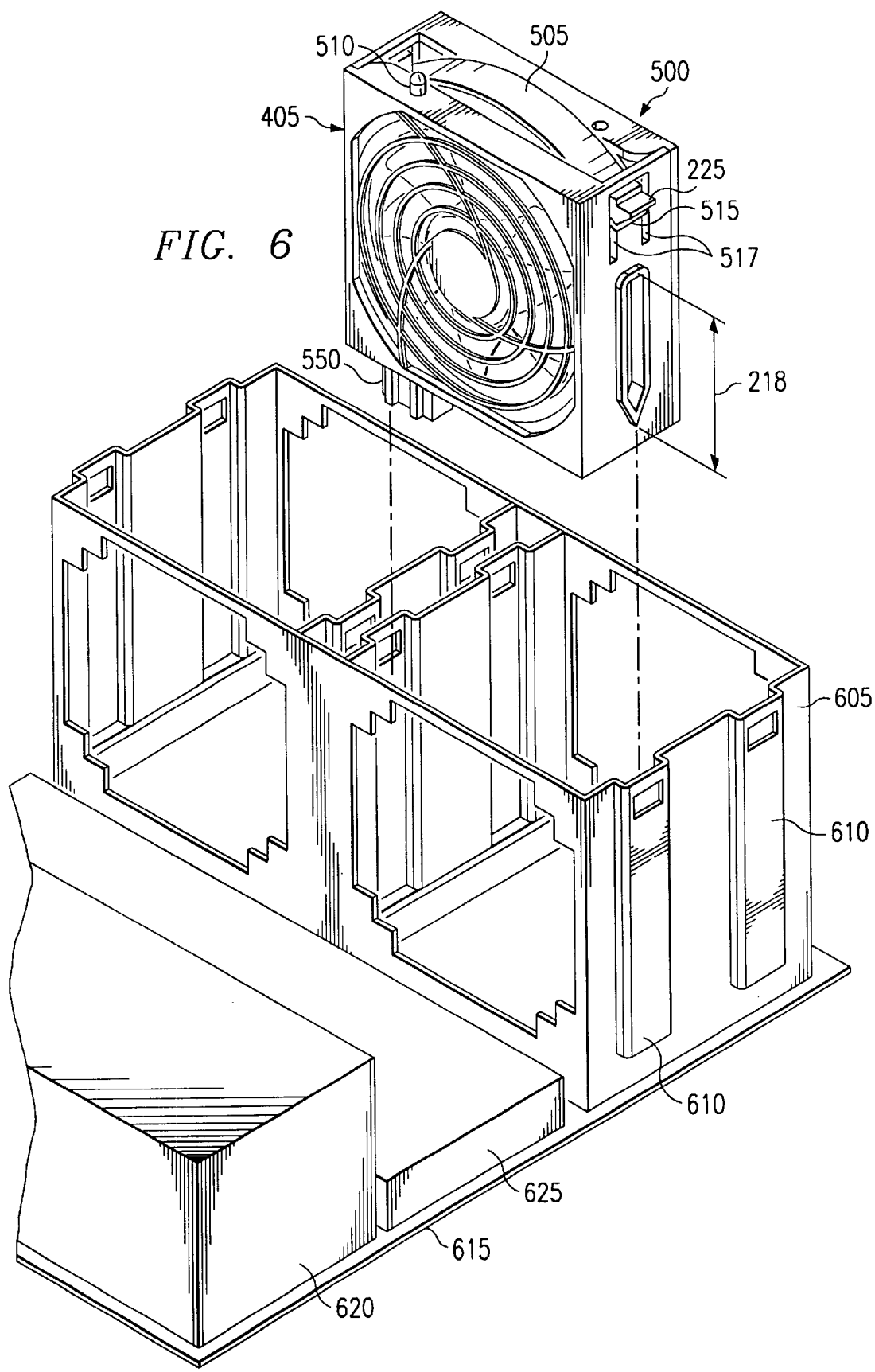
FIG. 6 is a schematic drawing showing an isometric view with portions broken away of a computer system assembly incorporating the fan and fan carrier assembly of FIG. 5.

In FIG. 6, a view in elevation of a computer system assembly incorporating fan carrier assembly 500 of FIG. 5 is shown. Fan carrier assembly 500 is preferably designed to be positioned in a slot of fan bay 605. In general, the positioning of fan carrier assembly 500 in fan bay 605 is aided by guide slot 610 disposed therein. Accordingly, guide slot 610 is preferably configured to receive guide rail 215 of fan carrier assembly 500 such that proper alignment, positioning and seating of fan carrier assembly 500 as well as hot swap plug 550 coupled thereto may be achieved. In one embodiment, length 218 of guide rail 215 may be designed such that the depth of travel of fan carrier assembly 500 in guide slot 610 of fan bay 605 is limited. Such a design may be employed to provide support for fan carrier assembly 500 once fan carrier assembly 500 is preferably engaged with fan bay 605.

In many server systems, fan bay 605 may be attached to a computer chassis (not expressly shown) and proximate motherboard 615 as well as the various components included in the server system. Examples of such components may include, but are not limited to, power supply 620, RAM (random access memory) slots 625, etc. As such, employing length 218 as described in the present disclosure may aid in preventing damage to motherboard 615 as well as the various components that may be included thereon.

Figure 7:
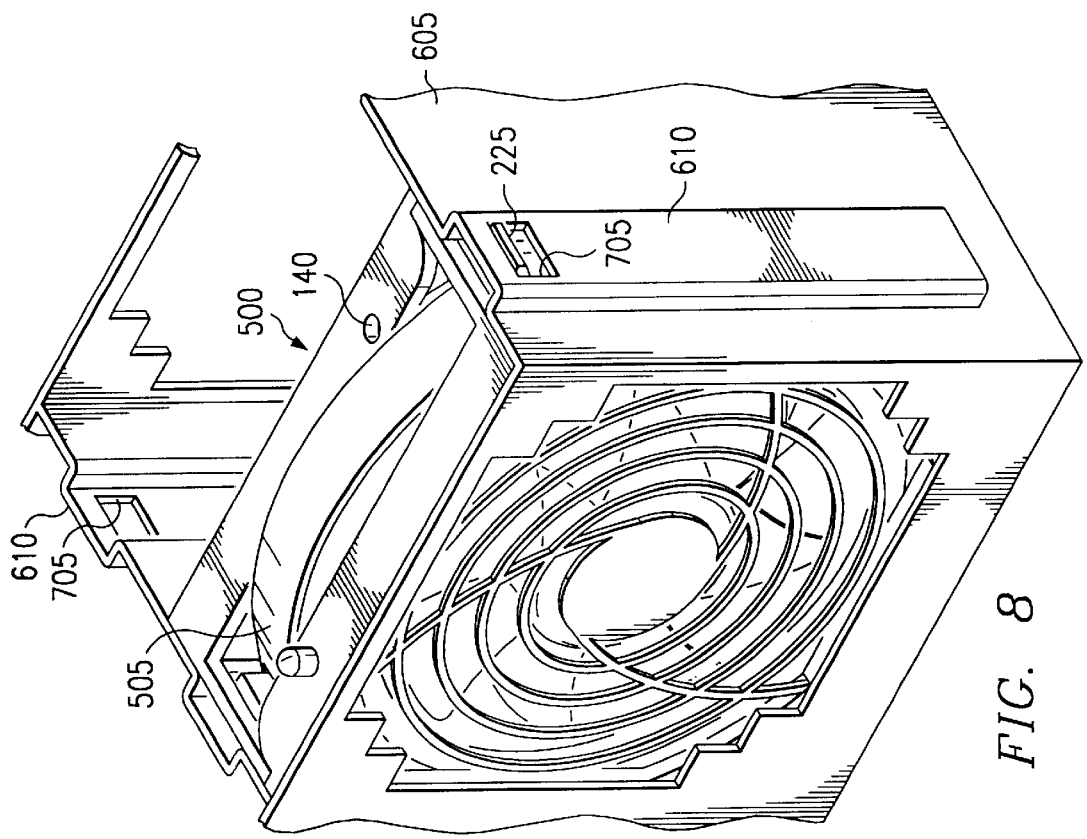
FIG. 7 is a schematic drawing showing an isometric view with portions broken away of a cantilever latch disengaged from a fan bay slot according to teachings of the present disclosure.
Figure 8:
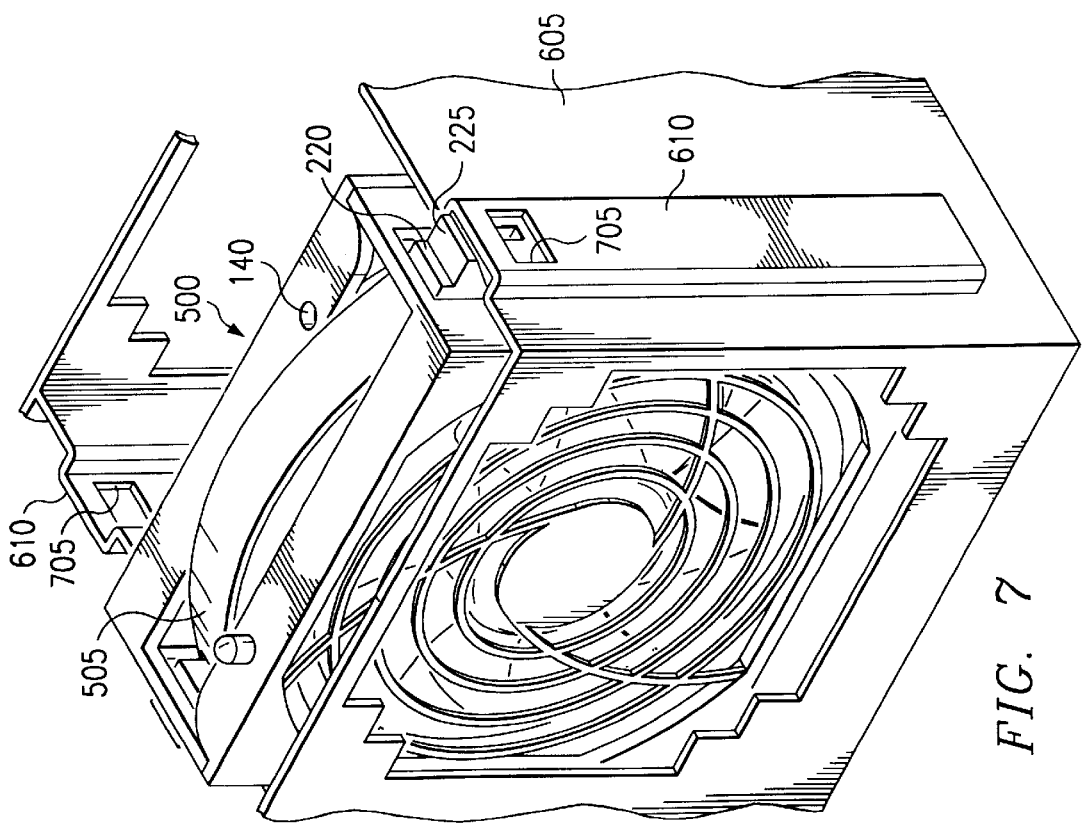
FIG. 8 is a schematic drawing showing an isometric view with portions broken away of the cantilever latch engaged with the fan bay slot according to teachings of the present disclosure.

Depicted in FIG. 7 is a view in elevation of cantilever latch 220 in a first, disengaged position from fan bay 605 and, depicted in FIG. 8, is a view in elevation of cantilever latch 220 in a second, engaged position with fan bay 605 according to teachings of the present disclosure. As fan carrier assembly 500 is positioned in fan bay 605, preferably using guide slot 610 and guide rail 215, tab 225 of cantilever latch 220 preferably engages fan bay notch 705. As mentioned above, the sloped surface of tab 225 preferably enables tab 225 to be displaced from fan carrier assembly's 500 path of travel as fan carrier assembly 500 is lowered into fan bay 605. The spring biased aspect of collet or cantilever latch 220 may then insert tab 225 into fan bay notch 705 once fan carrier assembly 500 reaches an appropriate depth within fan bay 605. In addition, tab 225 of cantilever latch 220 may be employed to rest fan carrier assembly 500 in an unseated position in fan bay 605.

Once engaged, as illustrated in FIG. 8, assembly 500 is preferably releasably secured in position. To effect removal of fan carrier assembly 500 from fan bay 605, handle 505 is preferably employed. Pulling handle 505 in a direction generally normal to bottom plate 305 will typically cause cantilever latches 220 and tabs 225 to be drawn inwards and towards one another. By drawing cantilever latches 220 inwards, tabs 225 may be disengaged and released from fan bay notches 705 of fan bay 605. Fan carrier assembly 500 may then be removed from fan bay 605. As such, fan carrier assembly 500 of the present disclosure provides an ergonomic carrier for hot-swap components capable of releasing latches and displacing a component with a single user motion.

Although the disclosed embodiments have been described in detail, it should be understood that various changes, substitutions and alterations can be made to the embodiments without departing from their spirit and scope. For example, although the present disclosure discusses computer system cooling fans, other hot-swap components may benefit from teachings including in the present disclosure.

What is claimed is:

1. A fan carrier assembly comprising:
   first and second sides with each side having respective first and second faces, first and second edges and a top and bottom edge;
   at least one aperture extending through the respective first and second sides;
   first and second ends with each end having respective first and second faces, first and second edges and a top and bottom edge;
   a cantilever latch disposed proximate the top edge of the respective first and second ends;
   the cantilever latch including a tab disposed thereon; and a handle operably coupled to each tab such that the handle may cause the cantilever latches to be drawn towards one another.

2. The fan carrier assembly of claim 1 further comprising the tab having ramped surface.

3. The fan carrier assembly of claim 1 further comprising a guide rail disposed on the first face of the respective first and second ends.

4. The fan carrier assembly of claim 1 further comprising a grating disposed in the aperture of at least one of the respective sides.

5. The fan carrier assembly of claim 1 further comprising:

a bottom plate; and the bottom plate, respective first and second sides and respective first and second ends cooperating with each other to form a box having an opening.

6. The fan carrier assembly of claim 5 further comprising:

an aperture disposed in the bottom plate; and the aperture operable to maintain a blind mate plug therein.

7. The fan carrier assembly of claim 5 further comprising a blind mate plug disposed on the bottom plate.

8. The fan carrier assembly of claim 1 further comprising at least one mechanical fastener disposed on the second face of the respective first and second sides.

9. The fan carrier assembly of claim 5 further comprising:

the first side, the first end and a first bottom plate integrally coupled with each other to form a first section;

the second side, the second end and a second bottom plate integrally coupled with each other to form a second section; and the first section and the second section having generally symmetrical configurations.

10. A computer system comprising:

a chassis;

a motherboard disposed within the chassis;

at least one processor operably coupled to the motherboard;

memory operably coupled to the motherboard and operably associated with the processor;

a fan bay operably disposed within the chassis, proximate the motherboard;

a fan carrier assembly with a fan disposed therein operable to form a box and engage the fan bay;

the fan carrier including first and second latches operable to engage respective first and second notches of the fan bay; and a handle operably coupled to the first and second latches to draw the first and second latches towards one another such that the first and second latches disengage from the first and second slots of the fan bay.

11. The computer system of claim 10 further comprising:

respective guide rails operably disposed on respective ends of the fan carrier assembly; and the respective guide rails operable to engage respective guide slots of the fan bay.

12. The computer system of claim 10 further comprising first and second cantilever latches.

13. The computer system of claim 10 further comprising:

a plurality of mechanical fasteners operably coupled to at least one interior surface of the fan carrier assembly; and the mechanical fasteners operable to engage the fan.

14. The computer system of claim 10 further comprising a fan grating operably disposed on at least a first side of the fan carrier assembly.

15. The computer system of claim 10 further comprising a blind mate plug operably coupled to the fan carrier assembly.

16. The computer system of claim 10 further comprising:

at least one LED aperture operably disposed on the fan carrier assembly; and an LED operably disposed in the LED aperture.

17. A fan carrier assembly comprising:

respective first and second sides;

respective first and second ends;

the sides and ends cooperating with each other to form a box with at least one open end;

the first and second ends including respective latches disposed proximate a top edge thereof;

the latches operable to releasably engage respective fan bay notches such that the fan carrier may be releasably secured therein;

the first and second ends further including respective guide rails operable to engage respective guide slots of the fan bay; and a handle operably coupled to the latches to disengage the latches from the fan bay notches such that the fan carrier may be removed therefrom.

18. The fan carrier assembly of claim 17 further comprising:

an LED aperture; and an LED disposed within the LED aperture.

19. The fan carrier assembly of claim 17 wherein the handle further comprises:

respective first and second ends;

a loop operably disposed proximate the first and second ends; and the handle loops further operable to engage a tab disposed on the respective latches such that the respective latches may be disengaged from the fan bay notches.

20. The fan carrier assembly of claim 17 further comprising a fan operably coupled to the respective first and second sides.

* * * * *